(12) United States Patent
Chien et al.

(10) Patent No.: US 8,004,038 B2
(45) Date of Patent: Aug. 23, 2011

(54) SUPPRESSION OF HOT-CARRIER EFFECTS USING DOUBLE WELL FOR THIN GATE OXIDE LDMOS EMBEDDED IN HV PROCESS

(75) Inventors: Hsing-Yi Chien, Taichung (TW); Yu-Chang Jong, Hsinchu (TW); Te-Yin Hsia, Hsin-Chu (TW); Ruey-Shin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1075 days.

(21) Appl. No.: 11/419,685

(22) Filed: May 22, 2006

(65) Prior Publication Data

US 2007/0267693 A1    Nov. 22, 2007

(51) Int. Cl.
*H01L 31/062* (2006.01)

(52) U.S. Cl. ......... 257/335; 257/328; 257/336; 257/339

(58) Field of Classification Search ................... 257/328, 257/335, 336, 339
See application file for complete search history.

(56) References Cited

U.S. PATENT DOCUMENTS

| | | | |
|---|---|---|---|
| 5,605,855 A | 2/1997 | Chang et al. | |
| 5,670,389 A | 9/1997 | Huang et al. | |
| 5,687,355 A | 11/1997 | Joarder et al. | |
| 5,712,501 A | 1/1998 | Davies et al. | |
| 5,777,364 A | 7/1998 | Cabbe et al. | |
| 5,821,577 A | 10/1998 | Cabbe et al. | |
| 5,841,170 A | 11/1998 | Adan et al. | |
| 5,886,921 A | 3/1999 | Davies et al. | |
| 6,004,137 A | 12/1999 | Cabbe et al. | |
| 6,144,069 A * | 11/2000 | Tung | 257/335 |
| 6,238,959 B1 | 5/2001 | Tung | |
| 6,573,561 B1 | 6/2003 | Chidambarrao et al. | |
| 6,740,920 B2 | 5/2004 | Chidambarrao et al. | |
| 6,909,143 B2 * | 6/2005 | Jeon et al. | 257/335 |
| 7,141,860 B2 * | 11/2006 | Khemka et al. | 257/471 |
| 2005/0073007 A1 | 4/2005 | Chen et al. | |

OTHER PUBLICATIONS

Chinese Patent Office, Chinese Office Action, Aug. 1, 2008, 6 Pages, Application No. 2007100859000.

* cited by examiner

*Primary Examiner* — Samuel A Gebremariam
(74) *Attorney, Agent, or Firm* — Haynes and Boone, LLP

(57) ABSTRACT

A semiconductor device includes a first high-voltage well having a first dopant disposed in a semiconductor substrate; a second high-voltage well having a second dopant disposed in the semiconductor substrate, laterally adjacent to the first high-voltage well; a low-voltage well having the second dopant disposed overlying the second high-voltage well; a drain region having the first dopant disposed in the first high-voltage well; a source having the first dopant disposed in the low-voltage well; and a gate disposed on the semiconductor substrate and laterally between the source and the drain, wherein the gate includes a thin gate dielectric and a gate electrode.

20 Claims, 2 Drawing Sheets

SUPPRESSION OF HOT-CARRIER EFFECTS USING DOUBLE WELL FOR THIN GATE OXIDE LDMOS EMBEDDED IN HV PROCESS

BACKGROUND

When thin gate oxide devices such as conventional metal-oxide-semiconductor field effect transistors (MOSFETs) are adopted for high-voltage applications, it takes multiple processes to overcome problems with respect to electrical performance and integration. As to high-voltage devices, lightly doped well implants are usually employed to optimize the breakdown voltage. For example, a thin gate oxide lateral double diffusion metal-oxide-semiconductor (LDMOS) transistor may utilize light well doping concentrations to increase the breakdown voltage. However, applying a light doping concentration to wells of a thin gate LDMOS could bring the device to normal-on.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
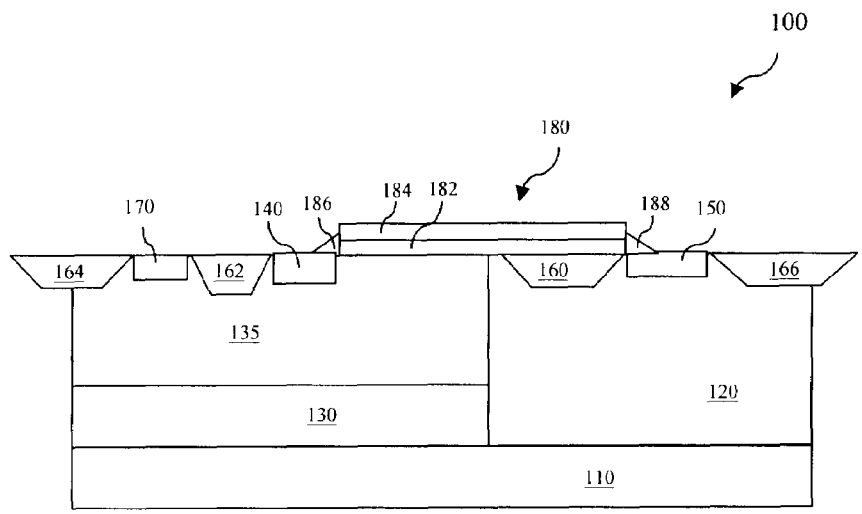
FIG. 1 is a sectional view of one embodiment of a high-voltage semiconductor device having a thin gate dielectric and a low-voltage well.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a sectional view of one embodiment of a semiconductor device 100. The semiconductor device 100 includes a substrate 110. The substrate 110 includes silicon. The substrate 110 may alternatively include silicon germanium, gallium arsenic, or other suitable semiconductor materials. The substrate 110 may further include other features such as a buried layer or an epitaxy layer.

Located in the substrate 110 are an N-well region 120 (also referred to as high-voltage N-well or HVNW). HVNW 120 has an N-type dopant and may have a doping concentration ranging between about $10^{15}$ and $10^{17}$ cm$^{-3}$. HVNW 120 may have a thickness ranging between about 2 micrometers and 5 micrometers.

A P-well region 130 (also referred to as high-voltage P-well or HVPW) is located in the substrate 110 and is adjacent HVNW 120. HVPW 130 has a P-type dopant and may have a doping concentration ranging between about $10^{15}$ and $10^{17}$ cm$^{-3}$. HVPW 130 may have a thickness ranging between about 1.5 micrometers and 4 micrometers. For example, HVPW 130 may be about 2.5 micrometers thick.

A P-well region 135 (also referred to as low-voltage P-well or LVPW) is disposed overlying HVPW 130 and laterally contacts HVNW 120. LVPW 135 has a P-type dopant and may have a doping concentration ranging between about $10^{16}$ and $10^{18}$ cm$^{-3}$. LVPW 135 may have a thickness ranging between about 0.5 micrometers and 2 micrometers. In another example, the thickness of LVPW 135 may range between about 1 micrometers and 1.5 micrometers.

Doping regions including HVPW 120, LVPW 130, and LVPW 135 may be formed by suitable doping processes such as ion implantation. As LVPW 130 and LVPW 135 substantially overlaps each other, LVPW 130 and LVPW 135 may be formed by series of chain implanting processes under the same patterned doping opening, with enhanced manufacturing efficiency. HVPW 130 and LVPW 135 may be formed with a P-type dopant such as boron, and HVNW 130 may be formed with an N-type dopant such as phosphorus. HVNW 120, HVPW 130, and LVPW 135 may be formed, respectively, by a plurality of processing steps now known or to be developed such as growing a sacrificial oxide on substrate 110, opening a pattern for the location of the N-well region or P-well region, and implanting the impurities.

An N-type dopant region 140 functioning as a source is disposed in LVPW 135. An N-type doped region 150 functioning as a drain is disposed in HVNW 120. The source 140 and drain 150 may be doped with an N-type impurity such as phosphorous for a N-channel metal-oxide-semiconductor (MOS) transistor. The source 140 and drain 150 may be formed by ion implantation and/or diffusion. Other processing steps may be further included to form the source 140 and drain 150. For example, a rapid thermal annealing (RTA) process may be used to activate the implanted dopant. The source and drain may have different doping profiles formed by multi-step implantation. For example, additional doping features such as light doped drain (LDD) or double diffused drain (DDD) may be included. Also, the source and drain may have different structures, such as raised, recessed, or strained. A channel is formed between the source 140 and the drain 150.

An isolation feature 160 may be disposed in HVNW 120 and laterally between the source 140 and the drain 150. The isolation feature may be adjacent the drain 150. The isolation feature 160 may be a shallow trench isolation (STI) or other suitable isolation structures such as a local oxidation of silicon (LOCOS) structure or a deep trench isolation. The isolation feature may have a thickness more than about 1 micrometer.

In addition to the isolation feature 160, the semiconductor device 100 may further include various isolation features such as 162, 164, and 166 located and designed to define various active features and isolate them from each other. The LVPW 135 may further include a P-doped region 170 that functions as a body contact to the LVPW 135. The body contact 170 may be doped with higher concentration of P-type impurity (such as boron) than that of the LVPW 135 to provide a contact to LVPW 135.

A gate 180 is formed on the substrate 110 and interposed laterally between the source 140 and drain 150. The gate 180 may extend over the isolation feature 160 between the source 140 and drain 150. The gate 180 includes a thin gate dielectric 182 having a thickness such that a low-voltage (for example, a voltage between about 1 volt and 6 volts) is applicable to operate the semiconductor device 100. The thickness of the thin gate dielectric may range between about 50 Angstrom and 300 Angstrom. For example, the gate dielectric 182 may have a thickness about 130 Angstrom. The gate dielectric 182 may include silicon oxide, high dielectric-constant (high k) materials, silicon oxynitride, other suitable material, or combinations thereof. The gate dielectric 182 may be formed using chemical vapor deposition (CVD), physical vapor deposition (PVD), atomic layer deposition (ALD), thermal oxide, other suitable processes, or combinations thereof. The gate 180 includes a gate electrode 184 to be coupled to metal interconnects and is disposed overlying the gate dielectric 182. The gate 180 may further include spacers 186 and 188 formed on both sides of the gate electrode 184 and the gate dielectric 182.

The semiconductor device 100 described above, as an N-channel metal-oxide-semiconductor (MOS) transistor, has a thin gate dielectric and a low-voltage well. The combination of LVPW 135 and HVPW 130 provides a graded well structure. The vertical graded well structure provides a way to improve both the breakdown voltage and threshold voltage. Furthermore, the graded well may be configured and formed differently. For example, the graded well may have a different doping profile such as a gradually varying doping profile. In another embodiment, various doping regions in the semiconductor device 100 may be alternatively reversed to provide a P-channel MOS transistor. Thus designed semiconductor device 100 is operable at a hybrid input including a low-voltage Vgs applied between the source 140 and the gate electrode 184, and a high-voltage Vds applied between the drain 150 and the source 140. In one embodiment, low-voltage Vgs applied between the gate and the source ranges from about 1 volts to 6 volts, and high-voltage Vds applied between the drain and the source ranges from about 12 volts to 100 volts. For example, Vgs may be about 5 volts and Vds may be about 40 volts. The gate 180 may further include gate spacers 186 and 188 disposed on edges of the gate dielectric 182 and the gate electrode 184.

Figure 2:
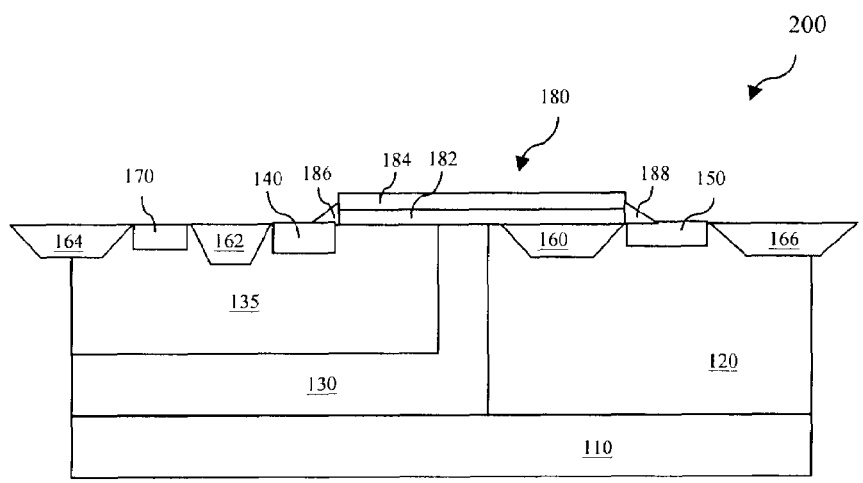
FIG. 2 is a sectional view of another embodiment of a high-voltage semiconductor device having a thin gate dielectric and a low-voltage well.

FIG. 2 is a sectional view of another embodiment of a semiconductor device 200 constructed according to aspects of the present disclosure. The semiconductor device 200 is substantially similar to the semiconductor device 100 in terms of configuration, composition, and formation except that HVPW 130 and LVPW 135 are configured somewhat differently. HVPW 130 is formed in the substrate 110 and disposed underlying LVPW 135. HVPW 130 is further extended vertically such that it is interposed between HVNW 120 and LVPW 135, and also laterally contacts both HVNW 120 and LVPW 135. The vertical portion of HVPW 130 interposed between LVPW 135 and HVNW 120 may have a thickness ranging between about 0.1 and 1 micrometer. For example, the vertical portion of HVPW 130 may have a thickness about 0.3 micrometer. The device 200 also includes the thin gate dielectric 182. The device 200 not only has a graded well but also a graded channel. The channel formed between the source 140 and the drain 150 therefore includes a portion of LVPW 135 and a portion of HVPW 130. The graded channel may also be configured and formed differently. For example, The graded channel may have gradually varying doping profile from the source to drain. The graded channel provides an additional way to adjust both the threshold voltage and the breakdown voltage. Alternatively, HVPW 130 may be configured underlying and laterally encompassing LVPW 135, such that a channel region between the source and the drain includes a portion of the second high-voltage well and a portion of the low-voltage well.

A process to form such configured p-wells 130 and 135 may be implemented by various techniques now known or later developed. In one example, the process includes utilizing a first dopant species such as boron to HVPW 130 and a second dopant species such as aluminum, gallium, or indium to form LVPW 135. If the semiconductor device 200 is a P-type transistor, the first dopant species may include phosphorus and the second dopant species may include arsenic or antimony. In another example, The process may include performing a light doping and an annealing thereafter to form HVPW 130 and performing a heavy doping to form LVPW 135 under a same doping opening. In another example, The process may include performing an angled light doping to form HVPW 135 and performing a heavy doping to form LVPW 135. In another example, the process may include performing a light doping under a first opening to form HVPW 135 and performing a heavy doping under a second opening to form LVPW 135. The another process may be alternatively implemented to form the graded well and channel structure such as utilizing spacers to offset outlines of HVPW 130 and LVPW 135.

It is understood that the semiconductor devices 100 and 200 are illustrated herein only as examples. The semiconductor devices described above may not be limited to an N-MOS device and can be extended to a P-MOS having a similar structure except that all doping types are reversed and dimensions may be modified according to PMOS designs. The P-MOS transistor has a thin gate dielectric, and a low-voltage N-well configured comparable to device 100 or device 200. The P-MOS is operable at a low-voltage Vgs and a high-voltage Vds. The low-voltage Vgs may range from about 1 V to 6 V. The high-voltage Vds may range from about 12 V to 100 V. Spirit of the semiconductor devices 100 and 200 may be further extended to other high-voltage devices such as drain-extended MOS (DEMOS) transistors and double-diffused-drain MOS (DDDMOS) transistors. The provided devices 100 and 200 may realize various advantages in particular applications. These advantages include chip size reduction, easy to integrate with high voltage devices, no extra process cost due to the easiness of integration to the existing high voltage device process, compatibility with logic circuits, and a new option for circuit design.

Figure 3:
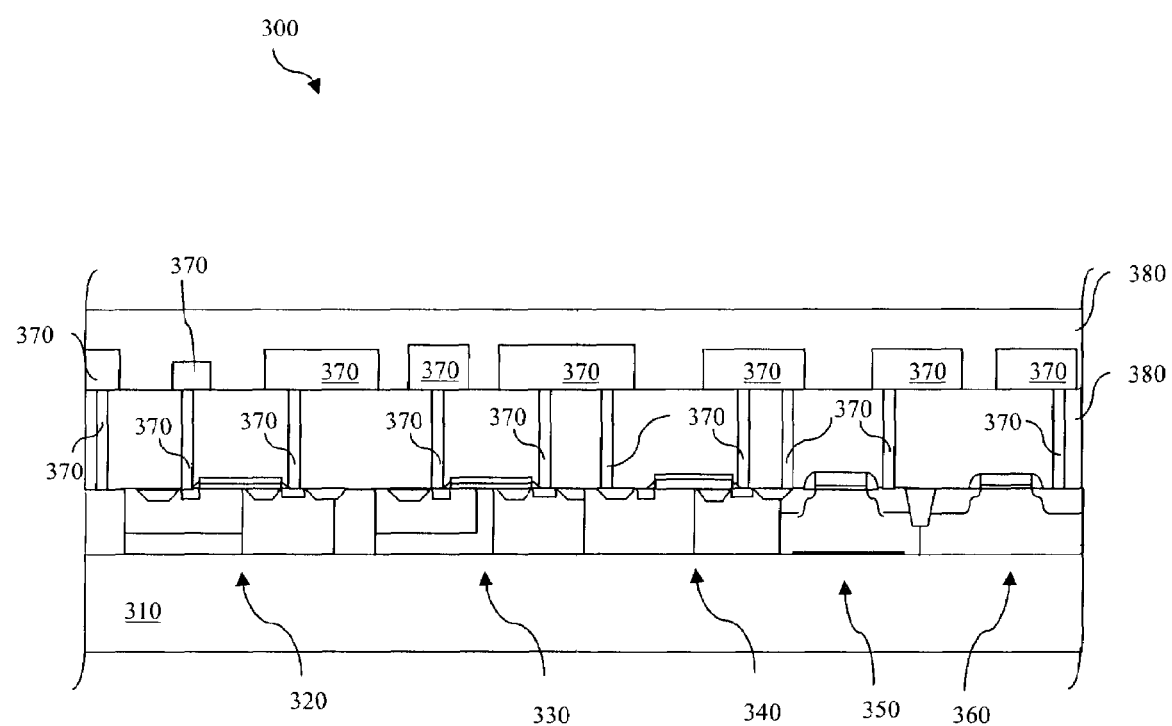
FIG. 3 is a sectional view of an integrated circuit having semiconductor devices of FIG. 1 and FIG. 2.

FIG. 3 is a sectional view of an embodiment of an integrated circuit 300 constructed according to aspects of the present disclosure. The integrated circuit 300 is one environment in which embodiments of the semiconductor devices 100 of FIG. 1 and/or 200 of FIG. 2 are integrated. The integrated circuit 300 is formed on a semiconductor substrate 310. The semiconductor substrate 310 may include an elementary semiconductor such as silicon, germanium, and diamond. The substrate may also include a compound semiconductor such as silicon carbide, gallium arsenic, indium arsenide, and indium phosphide. The substrate may comprise an alloy semiconductor such as silicon germanium, silicon germanium carbide, gallium arsenic phosphide, and gallium indium phosphide. The substrate may include an epitaxial layer. For example, the substrate may have an epitaxial layer overlying a bulk semiconductor. Further, the substrate may be strained for performance enhancement. For example, the epitaxial layer may comprise a semiconductor material different from those of the bulk semiconductor such as a layer of silicon germanium overlying a bulk silicon, or a layer of silicon overlying a bulk silicon germanium formed by a process including SEG. Furthermore, the substrate may comprise a semiconductor-on-insulator (SOI) structure such as a buried dielectric layer. Alternatively, the substrate may comprise a buried N-type layer and a buried P-type layer. In one embodiment, the buried dielectric layer may be a buried oxide (BOX) layer, such as that formed by a method referred to as separation by implantation of oxygen (SIMOX) technology, wafer bonding, selective epitaxial growth (SEG), or other proper method. Moreover, although not limited by the scope of the present disclosure, the buried dielectric layer may include silicon oxide, silicon nitride, silicon oxynitride, low k materials, air gap, combinations thereof, and/or other materials.

The integrated circuit 300 may include various semiconductor devices. The integrated circuit 300 may include a semiconductor device 320 similar to the semiconductor device 100 of FIG. 1. The device 320 may be an LDMOS transistor having a thin gate dielectric and low-voltage well. A high-voltage well of the same type is disposed underlying the low-voltage well. The integrated circuit 300 may include a semiconductor device 330 similar to the semiconductor device 200 of FIG. 2. The device 330 may be an LDMOS transistor having a thin gate dielectric and low-voltage well. The thin gate dielectric may have a thickness ranging between about 50 Angstrom and 300 Angstrom. A high-voltage well of the same type is disposed underlying the low-voltage well and further extended vertically and laterally contacts the low-voltage well such that a channel formed thereby includes a portion of the low-voltage well and a portion of the high-voltage well. The integrated circuit 300 may include a conventional LDMOS transistor 340 having a thick gate dielectric. The thick gate dielectric may have a thickness ranging between about 500 Angstrom and 3000 Angstrom. The integrated circuit 300 may further other devices 350 and 360 such as other high-voltage devices or conventional MOS transistors. Such designed and integrated devices may be compatible and integral to a fabrication technology to form high-voltage devices and be able to be formed thereby. The various semiconductor devices may be designed, configured, integrated differently in each particular application. The integrated circuit 300 forms or is integral to a power integrated circuit such as a power supply controller or a DC/DC converter, a display driver such as a thin-film transistor (TFT) display driver or a plasma display panel (PDP) driver, an input/output circuit, a logic circuit, memory cells, or combinations thereof.

The semiconductor device 320 or 330 are configured and operable at a low-voltage Vgs and a high-voltage Vds. For example, the device 320 or the device 330 may be operable at a 5 volts voltage applied between the gate and the source, and a 40 volts voltage applied between the drain and source. Thus semiconductor devices 320 and 330 thus designed may exhibit improved performance for low Vgs and high Vds operations. For example, a normal-on issue may be eliminated. Furthermore, each of the semiconductor devices 320 or 330 may alternatively be an LDMOS transistor formed in a triple-well structure modified to include a thin gate dielectric and a low-voltage well configured similarly to the device 100 of FIG. 1 or device 200 of FIG. 2. Further embodiments of high-voltage semiconductor devices 320 and 330 may also include, but are not limited to, vertical diffused metal-oxide-semiconductor (VDMOS) transistors, other types of high power MOS transistors such as drain-extended MOS (DEMOS) transistors or double-diffused-drain MOS (DDDMOS) transistors, Fin structure field effect transistors (FinFET), and strained MOS structures.

The device 340 may be configured and be operable at both high-voltages applied to the gate and the drain, respectively. The devices 350 and 360 may be configured and operable at high or low-voltages applied to the drain and the gate, respectively.

Gate dielectric of each device includes silicon oxide. The gate dielectric may alternatively include silicon oxynitride, or a high k dielectric, such as hafnium oxide, hafnium silicide, hafnium silicon oxide, hafnium silicon oxynitride, zirconium oxide, aluminum oxide, a hafnium dioxide-alumina ($HfO_2$—$Al_2O_3$) alloy, silicon nitride, Tantalum pentoxide or combinations thereof. Gate dielectric may be formed by thermal oxide, ALD, CVD, PVD, or combinations thereof. The gate dielectric may have a multi-layer structure, such as a first layer of silicon oxide by thermal oxidation, and a second layer of high k material. The gate dielectric may include more processing during formation such as nitrogen treatment of thermal oxide layer, and/or annealing of the gate dielectric stack including both silicon oxide and a high k layer.

Gate electrode of each device may be connected to an overlying interconnects structure through low resistant interfaces. The gate electrode includes conductive materials and may have multilayer structure. The gate electrode may be silicon-containing, germanium-containing, other conductive material, and combinations thereof. For example, the conductive material may include doped polycrystalline silicon (poly-Si), poly-SiGe, metal, metal silicide, metal nitride, metal oxide, carbon nanotube, or a combination thereof. The metal may include copper, tungsten, aluminum, aluminum alloy, palladium, titanium, tantalum, nickel, cobalt, and molybdenum. The metal silicide may include copper silicide, tungsten silicide, aluminum silicide, palladium silicide, titanium silicide, tantalum silicide, nickel silicide, cobalt silicide, erbium silicide, and molybdenum silicide. Gate electrode may be formed by CVD, PVD, silicidation, plating, and/or ALD. The formation of the gate electrode may include more process such as implant doping for polysilicon, or annealing for silicidation.

Spacers positioned on sides of each gate may include a dielectric material such as silicon nitride, silicon oxide, silicon carbide, silicon oxynitride, or combinations thereof. Spacers may have a multilayer structure and be formed by depositing dielectric material and then dry-etching. The high-voltage semiconductor devices may further include other features such as a stress layer overlying the substrate and gate features.

The integrated circuit 300 also includes interconnects 370 extending along and/or through one or more dielectric layers 380. The integrated circuit 300 may include more interconnects such as interconnects to various gate electrodes (not shown). The interconnects 370 may include copper, tungsten, titanium, titanium nitride, gold, aluminum, carbon nanotubes, carbon fullerenes, refractory metals, alloys of these materials and/or other materials, and may be formed by CVD, PVD, plating and/or other processes. The interconnects 370 may also include a multi-layer structure. For example, each interconnect 370 may comprise an adhesion layer possibly having titanium, titanium nitride, tantalum or tantalum nitride, a barrier layer possibly comprising titanium nitride or tantalum nitride, and a bulk conductive layer comprising copper, tungsten, aluminum, or aluminum alloy. The dielectric layer 380 may include silicon dioxide, FSG, Black Diamond® (a product of Applied Materials of Santa Clara, Calif.), Xerogel, Aerogel, amorphous fluorinated carbon, Parylene, BCB, Flare, and SiLK, and/or other materials, and may be formed by CVD, ALD, PVD, spin-on coating and/or other processes.

The semiconductor devices 320 to 360 may include additional isolation features to isolate each from other devices. The isolation features may include different structures and can be formed using different processing technologies. For example, an isolation feature may include local oxidation of silicon (LOCOS), shallow trench isolation (STI), and/or other suitable isolation structures. LOCOS may be formed using a thermal oxidation under a patterned mask layer. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

Thus, the present disclosure provides a semiconductor device. The device includes a first high-voltage well having a first dopant disposed in a semiconductor substrate; a second high-voltage well having a second dopant disposed in the semiconductor substrate, laterally adjacent to the first high-voltage well; a low-voltage well having the second dopant disposed overlying the second high-voltage well; a drain region having the first dopant disposed in the first high-voltage well; a source having the first dopant disposed in the low-voltage well; and a gate disposed on the semiconductor substrate and laterally between the source and the drain, wherein the gate includes a thin gate dielectric and a gate electrode.

In the semiconductor device, the low-voltage well may be laterally adjacent the first high-voltage well. The second high-voltage well is vertically extended to interpose between and laterally adjacent the first high-voltage well and the low-voltage well. The gate may be operable at a low-voltage between the gate and the source. The low-voltage may range between about 1 volts and 6 volts. The drain may be operable at a high-voltage between the drain and the source. The high-voltage may range between about 12 volts and 100 volts. One of the first dopant and the second dopant may include an N-type dopant and the another includes a P-type dopant. The semiconductor device may further include a trench isolation feature disposed in the first high-voltage well, between the drain and the source, and laterally adjacent the drain. The device may further include a body contact disposed in the low-voltage well, laterally away from the source and interposed by the trench isolation feature. The low-voltage well may have a doping concentration ranging between about $10^{16}$ and $10^{18}$ cm$^{-1}$. The low-voltage well may have a thickness ranging between about 0.5 and 2 micrometer. The low-voltage well may have a thickness ranging between about 1 and 1.5 micrometer. Each of the first and second high-voltage wells may have a doping concentration ranging between about $10^{15}$ and $10^{17}$ cm$^{-3}$. The second high-voltage well may have a thickness ranging between about 1.5 micrometer and 4 micrometers. The second high-voltage well may have a thickness about 2.4 micrometers. The gate dielectric layer may have a thickness ranging between about 50 and 200 nanometer. The gate dielectric layer may have a thickness about 130 nanometer. The low-voltage well and the second high-voltage well may be formed by series doping processes under a same diffusion mask opening.

The present disclosure also provides an integrated circuit. The integrated circuit includes a laterally double diffused metal-oxide-semiconductor (LDMOS) transistor formed in a semiconductor substrate, wherein the LDMOS transistor includes a thick gate dielectric; and at least one of a first device and a second device. The first device includes a first drain having a first dopant disposed in a first high-voltage well of the first dopant in a semiconductor substrate; a first low-voltage well of a second dopant disposed in the semiconductor substrate; a first source having the first dopant disposed in the low-voltage well; a second high-voltage well of the second dopant configured underlying the low-voltage well and laterally encompassing the low-voltage well, such that a channel region between the first source and the first drain includes a portion of the second high-voltage well and a portion of the low-voltage well; and a first gate having a first thin gate dielectric, disposed over the channel region and laterally between the first source and the first drain. The second device includes a second drain having the first dopant disposed in a third high-voltage well of the first dopant in the semiconductor substrate; a second low-voltage well of the second dopant disposed in the semiconductor substrate and laterally adjacent the third high-voltage well; a second source having the first dopant disposed in second the low-voltage well; a forth high-voltage well of the second dopant configured underlying the second low-voltage well; and a second gate having a second thin gate dielectric, disposed over the second channel region and laterally between the second source and the second drain. The thick gate dielectric may have a thickness ranging between about 500 Angstrom and 3000 Angstrom, each of the first gate dielectric and the second gate dielectric may have a thickness ranging between about 50 Angstrom and 300 Angstrom.

The present disclosure also provides a method. The method includes forming a first high-voltage well of the first dopant in a semiconductor substrate; forming a second high-voltage well of a second dopant and a low-voltage well of the second dopant configured such that the low-voltage well is disposed overlying the second high-voltage well and both the low-voltage well and the second high-voltage well are laterally adjacent the first high-voltage well; forming a source in the low-voltage well and a drain in the second high-voltage well; and forming a gate on the semiconductor substrate and interposed between the source and the drain, wherein a channel region between the source and the drain includes a portion of the second high-voltage well and a portion of the low-voltage well.

In the method, the forming of the second high-voltage well and the low-voltage well may include forming the second high-voltage well laterally encompassing the low-voltage well. The forming of the second high-voltage well and the low-voltage well may include utilizing a first dopant species to form the second high-voltage well and a second dopant species to form the low-voltage well. The first dopant species may be selected from the group consisting of phosphorus and boron. The second dopant species may be selected from the group consisting of aluminum, gallium, indium, arsenic, and antimony. The forming of the second high-voltage well and the low-voltage well may alternatively include performing a light doping; performing an annealing process after the performing of the light doping; and performing a heavy doping. The forming of the second high-voltage well and the low-voltage well may alternatively include performing an angled light doping to form the second high-voltage well; and performing a heavy doping to form the low-voltage well. The forming of the second high-voltage well and the low-voltage well may alternatively include performing a light doping under a first opening to form the second high-voltage well; and performing a heavy doping under a second opening to form the low-voltage well.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
   a first high-voltage well having a first dopant disposed in a semiconductor substrate;
   a second high-voltage well having a second dopant disposed in the semiconductor substrate, laterally adjacent to the first high-voltage well;
   a low-voltage well having the second dopant disposed overlying the second high-voltage well;
   a drain region having the first dopant disposed in the first high-voltage well;
   a source having the first dopant disposed in the low-voltage well; and
   a gate disposed on the semiconductor substrate and laterally between the source and the drain, wherein the gate includes a thin gate dielectric and a gate electrode, and the gate has a sidewall that is aligned with an edge of the drain region such that the sidewall and the edge are substantially coplanar.

2. The semiconductor device of claim 1, wherein the second high-voltage well is vertically extended to interpose between and laterally adjacent the first high-voltage well and the low-voltage well.

3. The semiconductor device of claim 1, wherein the gate and the source are operable at a low-voltage between the gate and the source.

4. The semiconductor device of claim 1, wherein the gate and the source are operable at a low-voltage between the gate and the source, wherein the low-voltage ranges between about 1 volts and 6 volts.

5. The semiconductor device of claim 1, wherein the drain and source are operable at a high-voltage between the drain and the source and the drain is interposed between first and second trench isolation features such the drain contacts at least one of the first and second isolation features.

6. The semiconductor device of claim 1, wherein the drain and source are operable at a high-voltage between the drain and the source, wherein the high-voltage ranges between about 12 volts and 100 volts.

7. The device of claim 1, wherein one of the first dopant and the second dopant includes an N-type dopant and the other includes a P-type dopant.

8. The device of claim 1, further comprising a trench isolation feature disposed in the first high-voltage well between the drain and the source and laterally adjacent to and in contact with the drain.

9. The device of claim 8, further comprising a body contact disposed in the low-voltage well, laterally away from the source and interposed by the trench isolation feature.

10. The device of claim 1, wherein the low-voltage well has a doping concentration ranging between about $10^{16}$ and $10^{18}$ $cm^{-3}$.

11. The device of claim 1, wherein the low-voltage well has a thickness ranging between about 0.5 and 2 micrometer.

12. The device of claim 1, wherein each of the first and second high-voltage wells has a doping concentration ranging between about $10^{15}$ and $10^{17}$ $cm^{-3}$.

13. The semiconductor device of claim 1, wherein the second high-voltage well has a thickness ranging between about 1.5 micrometer and 4 micrometers.

14. The device of claim 1, wherein the gate dielectric has a thickness ranging between about 50 and 300 Angstrom.

15. The device of claim 1, wherein the low-voltage well and the second high-voltage well are formed by series doping processes under a same diffusion mask opening.

16. A method for making a semiconductor device, the method comprising:
    forming a first high-voltage well of the first dopant in a semiconductor substrate;
    forming a second high-voltage well of a second dopant and a low-voltage well of the second dopant configured such that the low-voltage well is disposed overlying the second high-voltage well and both the low-voltage well and the second high-voltage well are laterally adjacent to the first high-voltage well;
    forming a source in the low-voltage well and a drain in the first high-voltage well; and
    forming a gate on the semiconductor substrate and interposed between the source and the drain, wherein the gate has a sidewall that is aligned with an edge of the drain region such that the sidewall and the edge are substantially coplanar, wherein a channel region between the source and the drain includes a portion of the second high-voltage well and a portion of the low-voltage well.

17. An integrated circuit, comprising:
    a laterally double diffused metal-oxide-semiconductor (LDMOS) transistor formed in a semiconductor substrate, wherein the LDMOS transistor includes a gate dielectric having a first thickness; and
    at least one of a first device and a second device, wherein the first device includes
        a first drain having a first dopant disposed in a first high-voltage well of the first dopant in a semiconductor substrate;
        a first low-voltage well of a second dopant disposed in the semiconductor substrate;
        a first source having the first dopant disposed in the low-voltage well;
        a second high-voltage well of the second dopant configured underlying the low-voltage well and laterally encompassing the low-voltage well, such that a channel region between the first source and the first drain includes a portion of the second high-voltage well and a portion of the low-voltage well; and
        a first gate having a first gate dielectric having a second thickness less than the first thickness, disposed over the channel region and laterally between the first source and the first drain, wherein the first gate has a sidewall that is aligned with an edge of the first drain such that the sidewall and the edge are substantially coplanar;
    and the second device includes:
        a second drain having the first dopant disposed in a third high-voltage well of the first dopant in the semiconductor substrate;
        a second low-voltage well of the second dopant disposed in the semiconductor substrate and laterally adjacent to and in contact with the third high-voltage well;

a second source having the first dopant disposed in second the low-voltage well;

a forth high-voltage well of the second dopant configured underlying the second low-voltage well; and a second gate having a second gate dielectric having a third thickness less than the first thickness, disposed over the second channel region and laterally between the second source and the second drain.

18. The integrated circuit of claim 17, wherein the gate dielectric has a thickness ranging between about 500 Angstrom and 3000 Angstrom, each of the first gate dielectric and the second gate dielectric has a thickness ranging between about 50 Angstrom and 300 Angstrom.

19. A semiconductor device comprising:

a first high-voltage well having a first dopant disposed in a semiconductor substrate;

a second high-voltage well having a second dopant disposed in the semiconductor substrate, the second high-voltage well being laterally adjacent to and in contact with the first high-voltage well;

a low-voltage well having the second dopant disposed overlying the second high-voltage well;

a drain region having the first dopant disposed in the first high-voltage well;

a source having the first dopant disposed in the low-voltage well; and a gate disposed on the semiconductor substrate and laterally between the source and the drain, wherein the gate includes a thin gate dielectric and a gate electrode, and the low-voltage well is laterally adjacent to and in physical contact with the first high-voltage well.

20. The semiconductor device of claim 19, wherein a first interface is formed where the low-voltage well is laterally adjacent to and in contact with the first high-voltage well and a second interface is formed where the second high-voltage well is laterally adjacent to and in contact with the first high-voltage well, the first and second interfaces being substantially coplanar.

* * * * *